(12) United States Patent
Peterson et al.

(10) Patent No.: US 11,659,692 B2
(45) Date of Patent: May 23, 2023

(54) RACK ASSEMBLY FOR VERTICAL AIRFLOW COOLED DEVICES

(71) Applicant: Microsoft Technology Licensing, LLC, Redmond, WA (US)

(72) Inventors: Peter Alfred Devick Peterson, Bothell, WA (US); Nilofer Rajpurkar, Seattle, WA (US); John Reed Hannig, Hillsboro, OR (US); Patrick Gerard Brogan, Redmond, WA (US); Scott Allen Densmore, Redmond, WA (US); Kenneth S. Hayd, Bothell, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/724,036

(22) Filed: Dec. 20, 2019

(65) Prior Publication Data
US 2021/0195802 A1 Jun. 24, 2021

(51) Int. Cl.
*H05K 7/20* (2006.01)
*G06F 1/20* (2006.01)

(52) U.S. Cl.
CPC ......... *H05K 7/20736* (2013.01); *G06F 1/206* (2013.01); *H05K 7/20* (2013.01); *Y02D 10/00* (2018.01)

(58) Field of Classification Search
CPC ...... H05K 7/20736; H05K 7/20; G06F 1/206; Y02D 10/00
USPC .................................................... 361/679.49
See application file for complete search history.

(56) References Cited

U.S. PATENT DOCUMENTS

| | | | | |
|---|---|---|---|---|
| 5,995,368 A | * | 11/1999 | Lee | H05K 7/20572 361/695 |
| 6,961,242 B2 | * | 11/2005 | Espinoza-Ibarra | H05K 7/20736 165/80.3 |
| 7,154,748 B2 | * | 12/2006 | Yamada | H05K 7/20572 361/690 |
| 7,215,552 B2 | * | 5/2007 | Shipley | H05K 7/20563 165/104.33 |
| 7,259,961 B2 | * | 8/2007 | Lucero | H05K 7/20563 165/121 |
| 7,394,654 B2 | * | 7/2008 | Zieman | G06F 1/20 312/236 |
| 7,420,806 B1 | * | 9/2008 | Lima | H05K 7/20736 165/104.33 |

(Continued)

FOREIGN PATENT DOCUMENTS

EP 3005020 A1 4/2016

OTHER PUBLICATIONS

"International Search Report and Written Opinion issued in PCT Application No. PCT/US20/060319", dated Feb. 12, 2021, 14 Pages.

*Primary Examiner* — Anatoly Vortman
(74) *Attorney, Agent, or Firm* — Schwegman Lundberg & Woessner, P.A.

(57) ABSTRACT

An assembly includes a lower sub-assembly containing a first fan, a middle sub-assembly supported above the lower sub-assembly, a bottom air flow control plane supported in the middle sub-assembly and having openings sized to fit multiple computers having vertical cooling air paths, and a top air flow control plane supported in the middle sub-assembly above the bottom air flow control plane and having openings sized to fit the multiple computers such that air is forced through the vertical cooling air paths.

18 Claims, 8 Drawing Sheets

(56) References Cited

U.S. PATENT DOCUMENTS

| | | | |
|---|---|---|---|
| 7,430,117 B2* | 9/2008 | Shabany | H05K 7/20581 165/80.3 |
| 7,688,593 B2* | 3/2010 | Byers | H05K 7/20572 361/721 |
| 7,766,733 B2* | 8/2010 | Kasahara | G06F 1/206 454/184 |
| 7,813,121 B2* | 10/2010 | Bisson | H05K 7/20563 361/679.51 |
| 8,064,200 B1* | 11/2011 | West | H05K 7/20563 361/695 |
| 8,223,492 B2* | 7/2012 | Ji | H05K 7/20572 361/692 |
| 8,446,725 B2* | 5/2013 | Lam | H05K 7/20145 361/695 |
| 8,780,551 B2* | 7/2014 | Farnholtz | H05K 7/20727 361/679.49 |
| 8,944,896 B2* | 2/2015 | Womac | H05K 7/1425 454/184 |
| 9,176,548 B2* | 11/2015 | Degner | G02B 6/0001 |
| 9,218,028 B2* | 12/2015 | Whang | G02B 6/001 |
| 9,788,461 B2* | 10/2017 | Van Gaal | H05K 7/20572 |
| 9,980,368 B2* | 5/2018 | Wu | H05K 9/0032 |
| 2005/0286222 A1* | 12/2005 | Lucero | H05K 7/20563 361/690 |
| 2007/0178822 A1* | 8/2007 | Lanus | H05K 7/20572 454/184 |
| 2007/0274039 A1* | 11/2007 | Hamlin | H05K 7/2019 361/695 |
| 2008/0094799 A1* | 4/2008 | Zieman | F28F 9/0268 361/695 |
| 2008/0113604 A1* | 5/2008 | Tufford | G06F 1/20 454/187 |
| 2008/0180918 A1* | 7/2008 | Baker | H05K 7/1488 361/727 |
| 2009/0109619 A1* | 4/2009 | Wise | H05K 7/20836 361/695 |
| 2014/0362519 A1* | 12/2014 | Degner | H05K 7/20154 361/679.46 |
| 2017/0331166 A1 | 11/2017 | Hasegawa | |
| 2018/0116069 A1* | 4/2018 | McGraw | H05K 7/1489 |

* cited by examiner

RACK ASSEMBLY FOR VERTICAL AIRFLOW COOLED DEVICES

BACKGROUND

Data centers commonly house thousands of computers and associated equipment to provide computing resources via network connections. The computers in many instances take the form of blades that are inserted into racks, with cooling air provided to ensure the blades do not overheat. The use of computers in the form of blades and racks, allows significant density of computing power in a compact format.

Racks are commonly designed to accommodate computers that are arranged in a blade format. The airflow proceeds horizontally through the blades. Some computers are not arranged in a blade format but may take shapes that are not conducive to a high-density arrangement in an equipment rack. In addition, some such computers are designed to sit upright on a desktop and may require the upright orientation where air flows vertically through the computers to properly cool the computers. It can be difficult to design racks that can hold a high density of such computers and still provide sufficient cooling air to keep the computers in a desirable operating temperature range.

SUMMARY

An assembly includes a lower sub-assembly containing a first fan, a middle sub-assembly supported above the lower sub-assembly, a bottom air flow control plane supported in the middle sub-assembly and having openings sized to fit multiple computers having vertical cooling air paths, and a top air flow control plane supported in the middle sub-assembly above the bottom air flow control plane and having openings sized to fit the multiple computers such that air is forced through the vertical cooling air paths

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized, and that structural, logical and electrical changes may be made without departing from the scope of the present invention. The following description of example embodiments is, therefore, not to be taken in a limited sense, and the scope of the present invention is defined by the appended claims.

An improved assembly for an equipment rack is modified to handle computing hardware that utilizes vertical airflow for cooling. Racks using the improved assembly may hold a higher density of such hardware than prior racks, making it better suited for datacenters, where hundreds if not thousands of hardware devices may be housed. Air flow to cool the hardware devices is provided from below the hardware devices and is carried upward through fan action of the hardware devices as opposed to being conveyed horizontally in prior assembly designs.

In addition, the improved assembly allows a rack of assemblies each holding multiple hardware devices, to be easily serviced/replaced via slides supporting subassemblies. One sub-assembly may hold computers, and a further sub-assembly may include additional devices, such as storage media cards, networking cards, and power supplies. The sub-assemblies may be quickly accessed via slides. The sub-assemblies with slides may be thought of as pull-out drawers.

Figure 1:
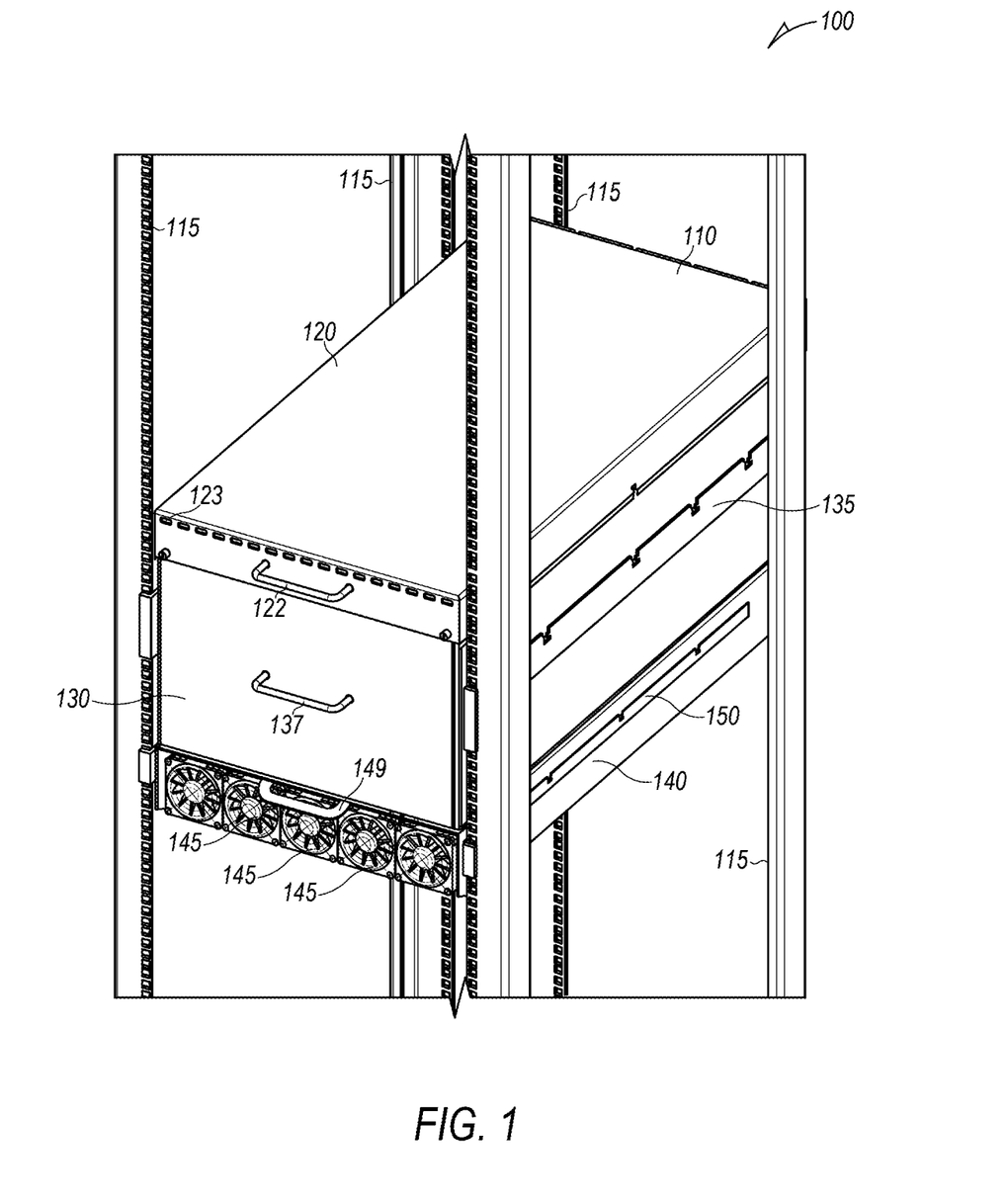
FIG. 1 is a block perspective view of a portion of an equipment rack for cooling equipment requiring vertical airflow according to an example embodiment.

FIG. 1 is a perspective view of a portion of an equipment rack indicated generally at 100. An assembly 110 is supported by multiple rails 115 comprising the equipment rack 100. Only one assembly 110 is shown, but the rails 115 may support multiple assemblies in various embodiments. Assembly 110 in one embodiment forms an enclosure that contains equipment, such as computers, storage devices, network cards, power supplies/power bricks, power boards, and other devices, one or more of which generate heat during operation. In one embodiment, the computers, such as Mac Pro® computers, are designed for vertical orientation during operation, drawing cooling air in through a bottom of the computer chassis, through the chassis, and out through a top of the chassis.

Assembly 110 in one embodiment includes multiple sub-assemblies. A first sub-assembly 120, referred to as an upper sub-assembly, comprises a plenum, basically an open space permitting airflow through it. One or more fans, referred to as a fan, to exhaust air to ambient may be provided to facilitate airflow through the first sub-assembly 120 but are not visible in this perspective view. The first sub-assembly 120 has a handle 122 for facilitating lifting of the first sub-assembly 120 to provide access to equipment, such as computers for installation and service. The first sub-assembly has sides, a front, a back, and a top, all formed of sheet metal that may be fairly light weight, such as $\frac{1}{8}^{th}$ inch steel sheet metal or other material providing sufficient structural support and heat conductivity.

The top may be formed as a double wall baffle to minimize the transfer of heat to adjacent assemblies when assembly 110 is installed in a rack. The double wall baffle may have holes or vents 123 positioned between the double walls to facilitate such heat transfer. Both ends of the double wall baffle may have holes, allow airflow through the double wall baffles. There may be about 1 cm between the double walls in one embodiment. Vent sizes and location may vary but vents should be positioned to radiate heat accumulating between the double walls.

The first sub-assembly 120 is supported by a second sub-assembly 130, referred to as a middle sub-assembly. The second sub-assembly is supported by a pair of slides 135 coupled to pair of rails 115. The combination of middle sub-assembly 130 and rails 115 may be refereed to as a sled. A handle 137 on a front of second sub-assembly 130 facilitates movement of the second sub-assembly 130 in a drawer opening and closing like manner to allow access to equipment, such as computers that are mounted within and supported by the second sub-assembly 130.

Note that the first subassembly 120 moves laterally with the second sub-assembly 130 via the slides 135. As with the first sub-assembly 120, the second subassembly 130 has a front, back, and sides formed of sheet metal that may be fairly light weight, such as $\frac{1}{8}^{th}$ inch steel sheet metal or other material providing sufficient structural support and heat conductivity.

A third sub-assembly 140, referred to as a lower sub-assembly, includes a fan 145 for blowing air into the assembly 110. Note that fan 145, such as an array of fans, are mounted on a front side of third sub-assembly 140 corresponding to a front side of assembly 110. The front side is opposite a back side of assembly 110 where the fans of first sub-assembly 120 are supported.

The arrangement of fans on opposite sides and different levels of the assembly 110 facilitates movement of air through the front side of the assembly 110 via fan 145 to the backside of the assembly 110 with a change in elevation, thus moving air vertically through the second sub-assembly 130. The air movement via the sets of fans is referred to as a push-pull arrangement.

As with the first sub-assembly 120, the second subassembly 130 has a front, back and sides formed of sheet metal that may be fairly light weight, such as $\frac{1}{8}^{th}$ inch steel sheet metal or other material providing sufficient structural support and heat conductivity. In addition, a bottom plate may be formed of thicker, light weight aluminum to support additional weight. A handle 147 may be used to move the third sub-assembly 140 via rails 150 in a manner similar to the movement of the second sub-assembly 130.

The sub-assemblies 120, 130, 140 may be formed of sheet metal or other suitable material in various embodiments, and when assembled together into the assembly 110 provide a substantially sealed enclosure to create an airpath to move cooling air past the equipment therein.

Figure 2:
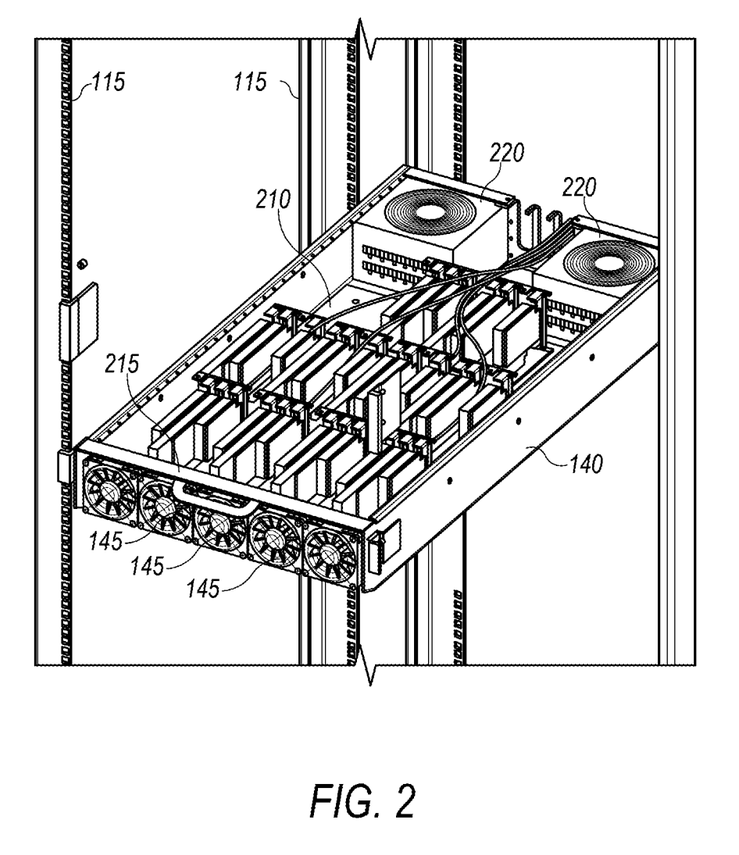
FIG. 2 is a perspective view of a third sub-assembly according to an example embodiment.

FIG. 2 is a perspective view of the third sub-assembly 140 showing an interior of the third sub-assembly 140. Note that like elements may be identified with the same reference number in multiple figures. Third sub-assembly 140 is a bottom sub-assembly that includes the fan 145 for drawing in air. Multiple different electrical cards 215 are supported by a base 210 of third sub-assembly 140. Example cards include network cards, storage cards, thunderbolt cards and others. Power supplies 220 may also be included. The fan 145 draw air into and past the cards. The top of the third sub-assembly 140 is open in one embodiment but will be enclosed by a lower plane of the second sub-assembly 130 during use.

In one embodiment, there are ten sets of cards 215, each set corresponding to a computer supported in the second sub-assembly 130 and connected to such computers by cabling.

Figure 3:
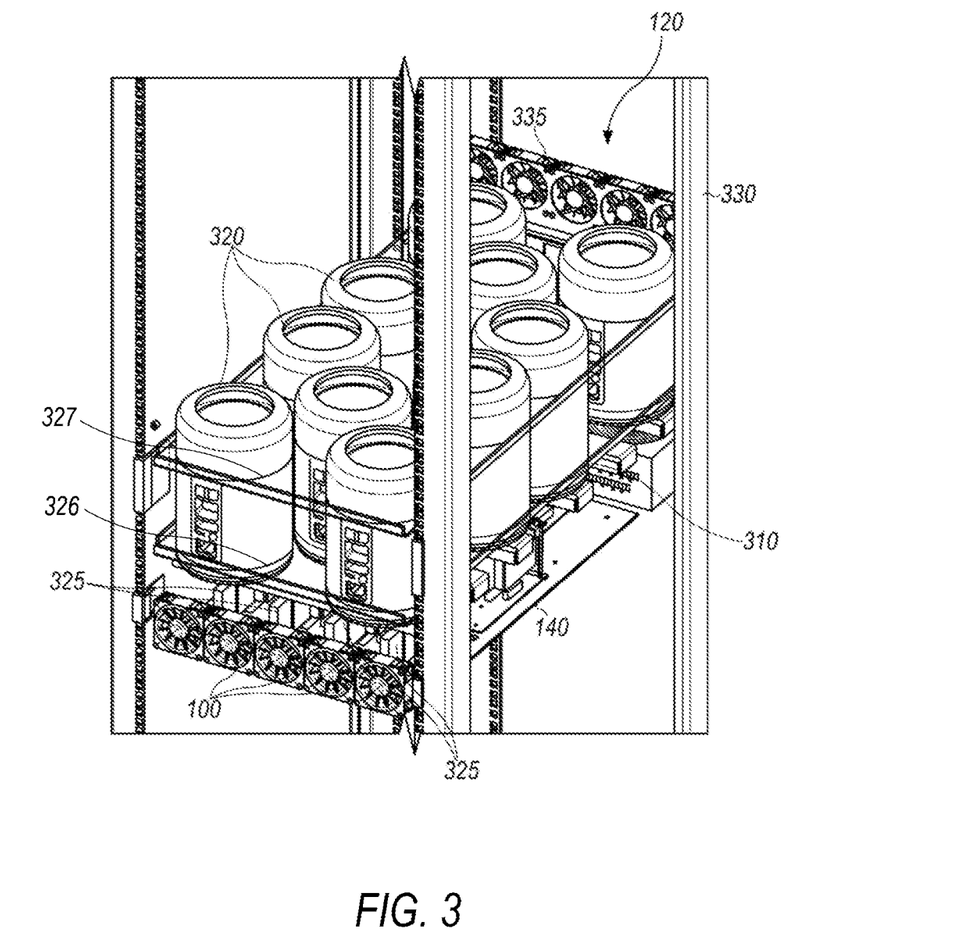
FIG. 3 is perspective view of the second sub-assembly according to an example embodiment.

FIG. 3 is block perspective view of the second sub-assembly 130 mounted above the third sub-assembly 140 and having a lower airflow control plane 310 that both encloses the third sub-assembly 140 and holds multiple computers 320 in position within the second sub-assembly 130. Note that the sides of the sub-assemblies 130, 140 are not shown to better illustrate their interior construction.

The computers 320 are supported by multiple bars 310 extending widthwise from side to side of the second sub-assembly 130. In further embodiments, the bars may extend lengthwise from the front of the second sub-assembly 130 to the back of the second subassembly 130. In one embodiment, ten such computers are supported in multiple staggered rows. Outside rows of computers 320 include four computers 120, with a middle row of two computers 320 between. The two computers in the middle row are staggered between the computers in the rows of four computer 320. The bars 325 have a cross section width that is less than the width or radius of the computers 320. In one embodiment, the computers 320 comprise MAC Pro® computers, which include internal fans that draw air in from their bottom portions and expel air out their top portion.

The bars 325 may include cross bars running width-wise to further support the computers 320. The bars 325 may be supported by the sides of sub-assembly 130 in various embodiments and may be formed of steel or other suitable material for supporting the weight of the computers 320.

The lower airflow control plane 310 serves to both divert air into the bottom portions of the computers 320 and also includes openings 326 having perimeters that closely match the perimeters of the computer 320 to hold the computers 320 snugly in place. The openings may be positioned to ensure adequate structural support for computers 320 and to optimize the number of computers 320 that may be placed and supported within the second sub-assembly 130.

The lower airflow control plane 310 may include one or more openings for cables running between the cards and power supplies supported in the third sub-assembly 140. Such opening or openings should be sized to allow passage of the cables with minimal air leakage through such openings to optimize airflow through the computers 320.

An upper airflow control plane 330 is positioned below the tops of the computers to create an upper level airflow path toward rear fans 335 that may be positioned to exhaust air from the upper level airflow path. The first sub-assembly 110, not shown in FIG. 3, acts to enclose the upper level airflow path. The rear fans 335 may be supported by the upper airflow control plane 330, the first sub-assembly 110, or a rear panel of the second sub-assembly 120 in various embodiments. The airflow control planes 310, 330 may have a pan type of shape, with raised edges to provide structural support.

The upper airflow control plane 330 may having similarly positioned openings 327 for the computers 320 but are slightly larger in diameter to allow easier insertion and removal of computers 320. The sides of the second sub-assembly may have support structures to support the lower and upper airflow control planes. In addition, the upper airflow control plane 330 may include handles (not shown in FIG. 3) that extend up into the first sub-assembly plenum space for ease of removal to service the computers 320.

In some embodiments, the upper airflow control plane 330 may be optional, and the rear fans 335 may be supported by sides of the second sub-assembly 130. However, the upper airflow control plane 330 enhances the vertical airflow through the computers 320 and provides for a more efficient overall airflow path out the rear fans 335, preventing heat buildup in eddies that may form in a more open space and resultant hot spots.

Figure 4:
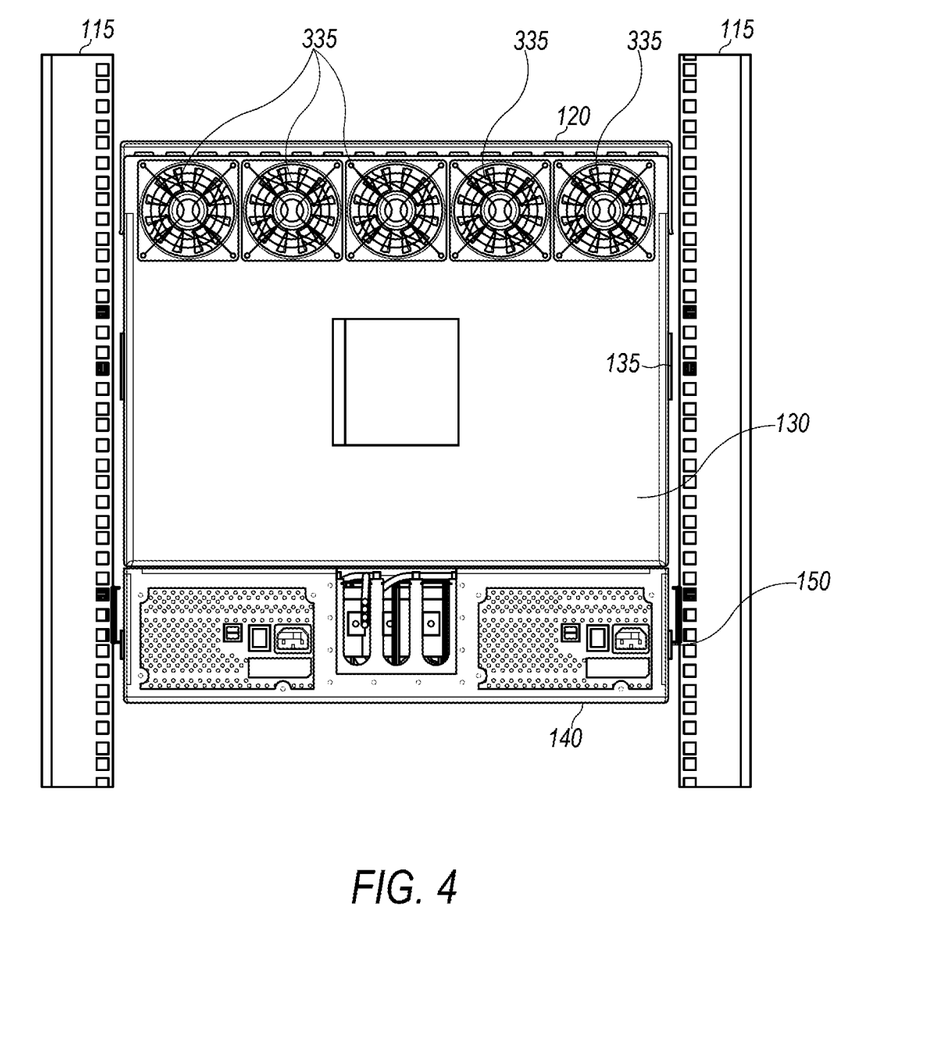
FIG. 4 is a rear elevation view of an assembly according to an example embodiment.

FIG. 4 is a rear elevation view of the assembly 110 illustrating the back of the assembly 110 and showing the fans 335. An optional opening in the rear of assembly 110 is shown to allow access to cables during design.

Figure 5:
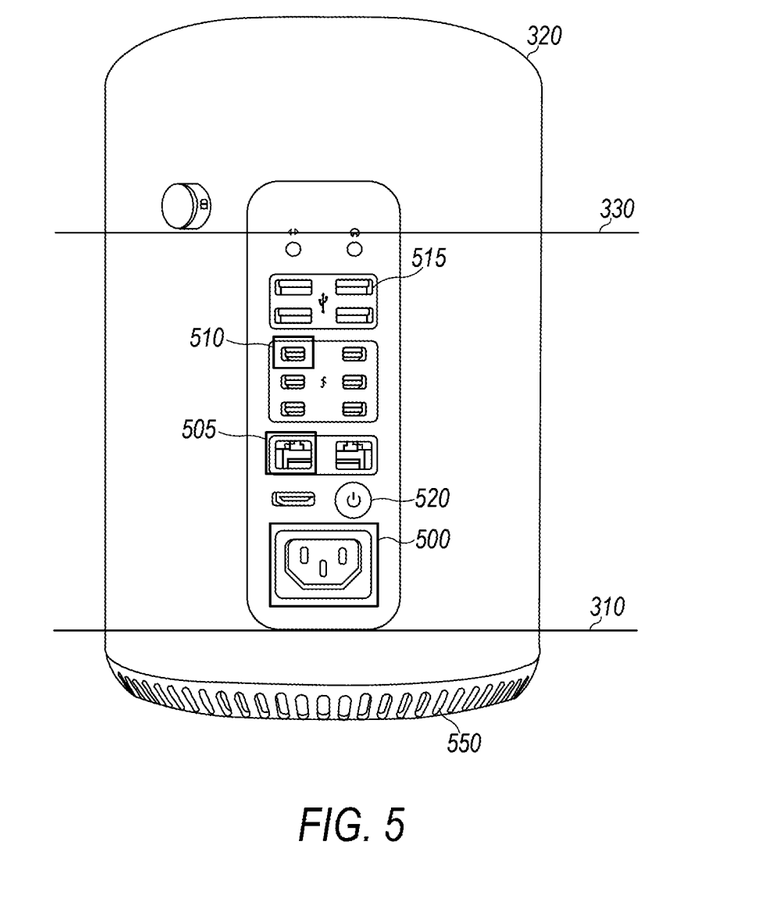
FIG. 5 is a rear elevation view of a computer illustrating example positioning of airflow control planes according to an example embodiment.

FIG. 5 is a rear elevation view of a computer 320. Upper and lower airflow control planes 330 and 310 are illustrated as lines to demonstrate the relative positioning of the airflow control planes 310, 330 with respect to cable access to a connection portion of the computer 320. The particular computer shown is a Mac Pro® computer. There are several connections that end up being accessible between the airflow control planes in one embodiment, including a power connection 500, ethernet connection 505, Thunderbolt 2 connections 510, USB ports 515, power switch 520, and others.

The airflow control planes 310, 330 thus provide a pair of barriers to airflow to allow access to the connections and ports of computer 320 and ensure the majority of cooling air flow proceeds vertically through the computers 320. Note that for different computers, the placement of the airflow control planes may be varied as a function of the location of the connections and ports. For instance, a non-planar lower air flow control plane may be used to allow access to one or more particular ports while still maintaining desired airflow characteristics and avoiding significant eddy currents. In one embodiment, the upper airflow control plane 330 may be omitted. While the upper airflow control plane 330 reduces the potential for eddy currents, the assembly will still operate without such a control plane. The upper airflow control plane 330 also helps maintain the computers 320 in place for shipment and drop testing.

In one embodiment, computer 320 includes air vents 550 around a bottom of the computer 320, which are used for allowing air to enter the computer 320 and proceed vertically therethrough. The use of bars 325 to support the computers 320 ensures that air can flow freely from the third sub-assembly to the bottoms of the computers 320, while the lower airflow control plane 310 ensures the majority of airflow proceeds vertically through the computers 320.

Figure 6:
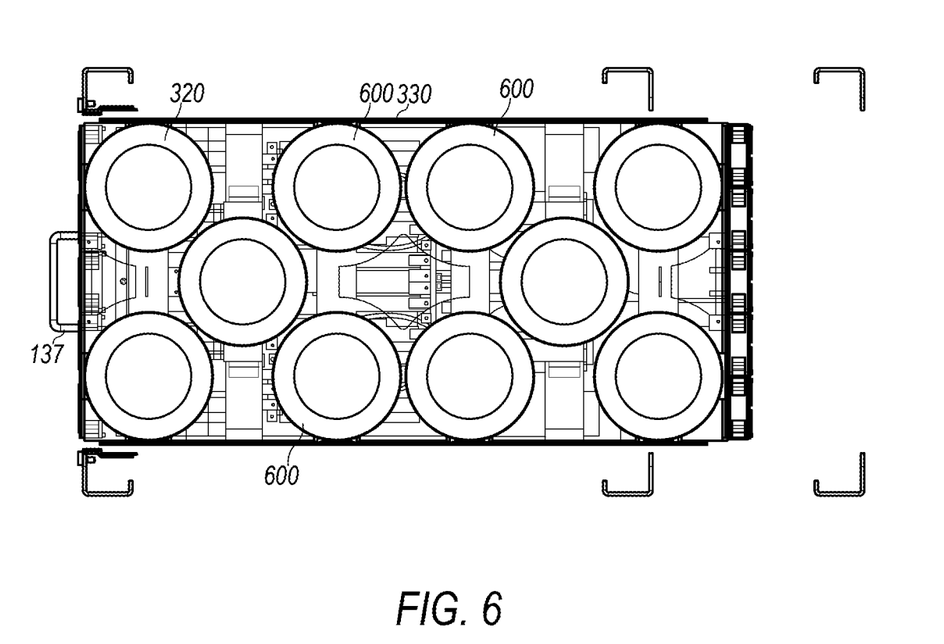
FIG. 6 is a top view of the upper airflow control plane according to an example embodiment.

FIG. 6 is a top view of the upper airflow control plane 330 illustrating the placement of holes or openings 600 for computers 320. As previously indicated, there are two outside rows of four openings and a pair of openings between the outside rows. There are ten openings 600 for ten computers 320.

Figure 7:
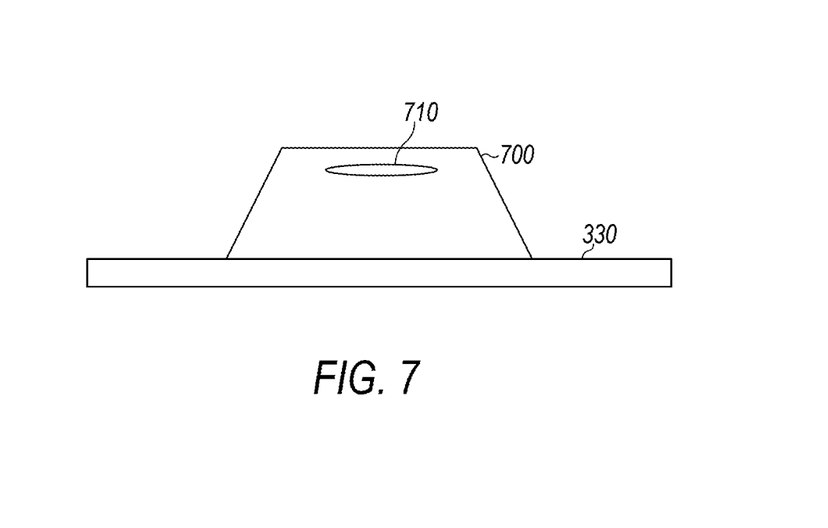
FIG. 7 is a side view of the upper airflow control plane according to an example embodiment.

FIG. 7 is a side view of the upper airflow control plane 330. A handle 700 is shown rising up from a base of control plane 330. The handle 700 in one embodiment extends into the plenum for ease of access and removal of the upper airflow control plane 330. A gripping opening 710 may be provided near an apex of the handle 700.

The handle 700 may take many different shapes and in one embodiment is simply stamped from a same piece of sheet metal as is used for forming the upper airflow control plane 330 and is bent upward substantially orthogonal or otherwise to facilitate removal and insertion of the upper airflow control plane 330. One handle 700 is shown on one side of the upper airflow control plane 330. An opposite side of the upper airflow control plane 330 may have a additional handle 700 that may have the same shape.

Figure 8:
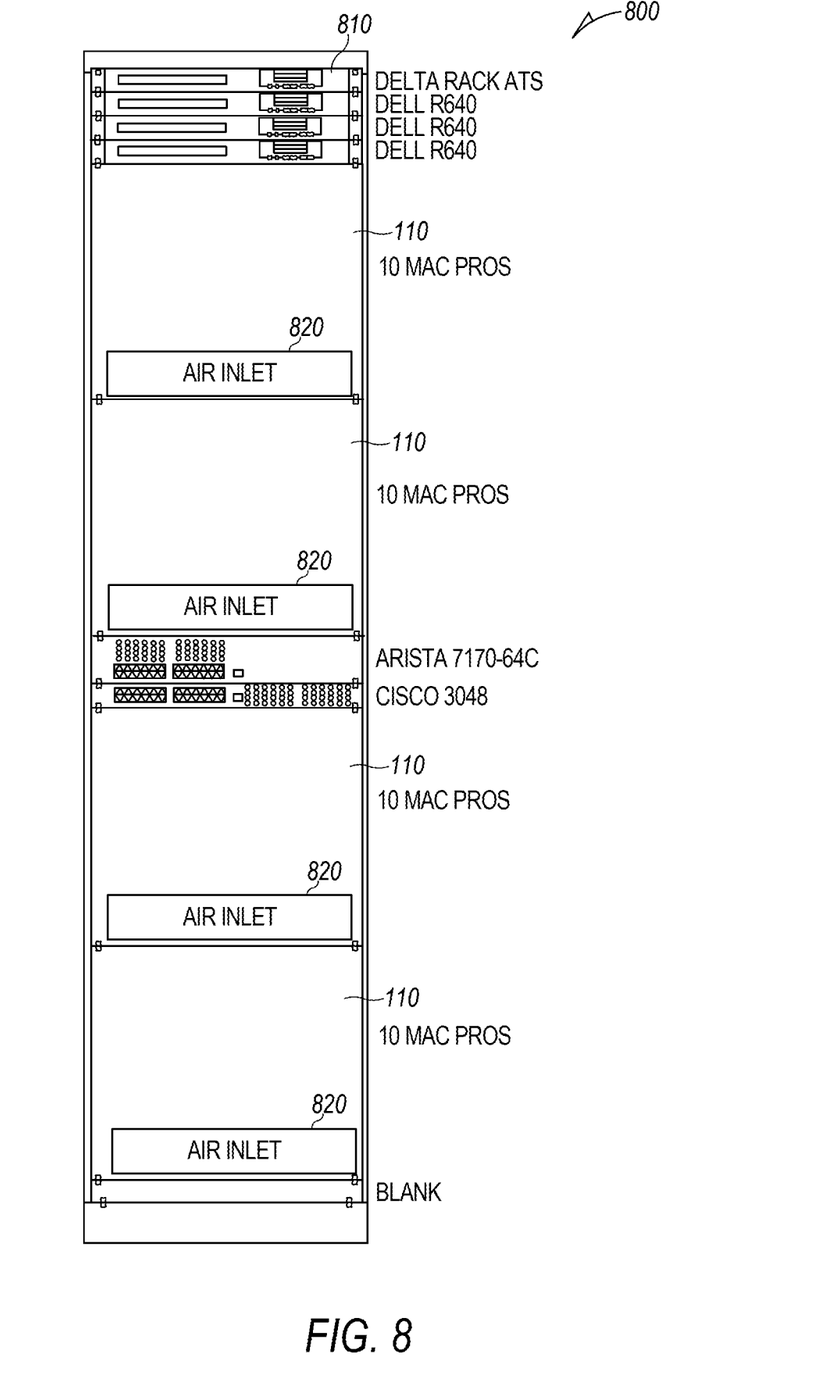
FIG. 8 is a block diagram illustrating a rack with four assemblies arranged in a stack according to an example embodiment.
Figure 9:
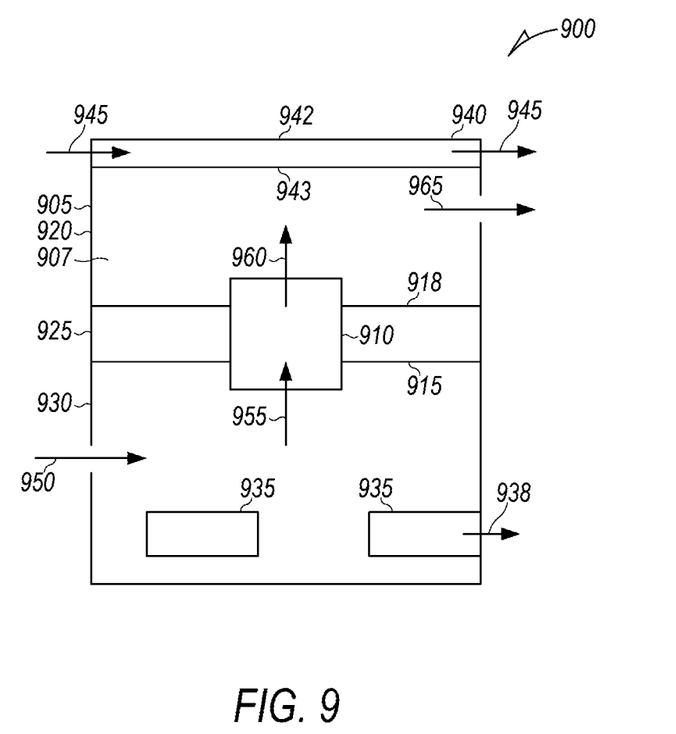
FIG. 9 is a block diagram illustrating airflow within an example assembly.

FIG. 8 is a block diagram illustrating a rack 800 with four assemblies 110 arranged in a stack. Commercially available rails sold at least by Dell may be used. Other equipment 810 may be included as shown. In one embodiment, a delta rack automatic transfer switch (ATS) for power transfer may be used with Dell ready rails for building the rack and providing the drawer like capability for any of the sub-assemblies shown or described herein. Air inlets 820 may also be provided for each assembly 110, 100431 FIG. 9 is a block diagram illustrating airflow within an example assembly 900. Assembly 900 includes walls 905 providing an enclosed volume 907 in which computers 910 may be supported. A bottom airflow control plane 915 extends across the enclosed volume 907 to position the computers 910 in a desired manner to optimize the number of computers that can be enclosed in the enclosed volume 907.

Assembly 900 is divided into three sub-assemblies in one embodiment, a top sub-assembly 920, a middle sub-assembly 925, and a lower sub-assembly 930. Control planes 915 and 918 are supported within the middle sub-assembly 925, which also houses the multiple computers 910. Bottom sub-assembly 930 may include multiple cards and power supplies indicated at 935. Power supplies may include fans that vent outside the bottom sub-assembly 935 as indicated by arrow 938.

In operation, fans indicated at arrows 950 and 965 operate to push the air in to the lower subassembly, also referred to as a bottom drawer to cool the cards 935 and pressurize the bottom draw to supply intake air to the computers 910 for cooling. The bottom drawer may also have one or more power supplies 935 which blows part of the incoming air out their backs at 938 to cool the power supplies.

The top sub-assembly 920 comprises a top 940. In one embodiment, the top 940 has a double wall as indicated at 942 and 943, which serves as an insulator for the assembly 940 and removes heat from assembly 900 as indicated by arrows 945.

Multiple arrows 945, 950, 955, 960, and 965 are used in FIG. 9 to indicate airflow. In one embodiment, air enters the lower assembly 930 as indicated at arrow 950, The air may be moved via a fan such as an array of fans (not shown in FIG. 9) at the entry point. The airflow proceeds toward the computers 910 and may assist in removing heat generated by the cards and power supplies 935. The airflow proceeds into a base of the computers 910 as indicated at arrow 955 and further proceeds out the top of the computers 910 as indicated at arrow 960. Note that while arrow 955 shows air entering through the bottom of computers 910, the actual flow may enter the computers 910 through vents on the sides of the computers near their bottoms.

The airflow through the computers picks up heat generated by operation of the computers and is confined by the top 940. The airflow then proceeds to exit the top sub-assembly as indicated by arrow 965. The exiting of the airflow may be added by a fan or array of fans (not shown in FIG. 9). Airflow through the computers 910 may also be assisted via a fan or fans within the computers 910.

EXAMPLES

1. An assembly includes a lower sub-assembly containing a first fan a middle sub-assembly supported above the lower sub-assembly, a bottom air flow control plane supported in the middle sub-assembly and having openings sized to fit multiple computers having vertical cooling air paths, a top air flow control plane supported in the middle sub-assembly above the bottom air flow control plane and having openings sized to fit the multiple computers such that air is forced through the vertical cooling air paths, and a top sub-assembly supported above the middle sub-assembly.

2. The assembly of example 1 and further comprising a second fan disposed above the top air flow control plane to act in cooperation with the first fan to move air through the vertical cooling air paths of the multiple computers.

3. The assembly of example 2 wherein the top sub-assembly comprises a double walled top and forms a plenum to facilitate air flow through the second fan.

4. The assembly of any of examples 1-3 and further comprising middle rails to moveably support the middle sub-assembly.
5. The assembly of example 4 and further comprising bottom rails to movably support the bottom sub-assembly.
6. The assembly of any of examples 1-5 wherein the computers are cylindrical in shape and wherein the airflow control planes contain round openings corresponding to the cylindrical shape of the computers.
7. The assembly of any of examples 1-6 wherein the openings in the top airflow control plane are larger than the openings in the bottom airflow control plane.
8. The assembly of any of examples 1-7 wherein the lower sub-assembly comprises multiple cards for storage and networking.
9. The assembly of example 8 wherein the bottom air flow control plane has an opening positioned to pass cables from the cards in the lower sub-assembly to the connectors of the computers in the middle sub-assembly.
10. The assembly of example 9 wherein the cables comprise network cables, and wherein at least two network cables from cards are combined into a single network cable prior to passing through the opening in the bottom air flow control plane.
11. The assembly of any of examples 1-10 wherein the upper air flow control plane includes handles extending upward to facilitate lifting of the upper air flow control plane for providing physical access to the computers.
12. A system includes a lower sub-assembly including a first fan, a middle sub-assembly supported above the lower sub-assembly, a bottom air flow control plane supported in the middle sub-assembly and having openings sized to fit multiple computers having vertical cooling air paths such that air is forced through the vertical cooling air paths, and a second fan disposed above the bottom air flow control plane to act in cooperation with the first fan to move air through the vertical cooling air paths of the multiple computers.
13. The system of example 12 and further comprising a plenum positioned above the middle sub-assembly to facilitate air flow through the second fan.
14. The system of any of examples 12-13 and further including middle rails to moveably support the middle sub-assembly and bottom rails to movably support the bottom sub-assembly.
15. The system of any of examples 12-14 wherein the computers are cylindrical in shape and wherein the bottom airflow control plane contains round openings corresponding to the cylindrical shape of the computers.
16. The system of any of examples 12-15 wherein the lower sub-assembly comprises multiple cards for storage and networking and one or more power supplies each having a fan coupled to expel air outside the assembly to cool the one or more supplies.
17. The system of any of examples 12-16 and further comprising a top airflow control plane supported in the middle sub-assembly above the bottom air flow control plane and having openings sized to fit the multiple computers such that air is forced through the vertical cooling air paths.
18. A method includes supporting multiple computers at their bases via multiple bars, wherein the bars are formed to allow airflow into the bases of the multiple computers, actively providing air to the bases of the multiple computers via a bottom fan, blocking vertical airflow along an outside of the multiple computers via a bottom plane disposed part-way up from the bases of the computers to ensure air flows vertically through the multiple computers, and actively removing air from tops of the computers via a top fan.
19. The method of example 18 and further comprising assisting airflow vertically through the multiple computers via fans disposed in respective multiple computers.
20. The method of any of examples 18-19 and further comprising cooling multiple cards supported below the multiple computers with the air flow actively provided to the bases of the multiple computers.

Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

The invention claimed is:
1. An assembly comprising:
a lower sub-assembly containing a first fan;
a middle sub-assembly supported above the lower sub-assembly;
a bottom air flow control plane supported in the middle sub-assembly and having bottom openings, each bottom opening having a first perimeter sized to fit and support a corresponding computer by supporting a perimeter of a corresponding computer chassis having a maximum perimeter less than the first perimeter, the corresponding computer chassis having a vertical cooling air path through the computer chassis;
a top air flow control plane supported in the middle sub-assembly above the bottom air flow control plane and having top openings having a second perimeter larger than the maximum perimeter of the corresponding computer chassis, each top opening sized to allow insertion of the corresponding computer chassis through each top opening, the bottom air flow control plane and the top air flow control plane providing an-enclosure such that air is forced through a corresponding bottom opening of the computer chassis, the vertical cooling air path through each corresponding computer chassis, and a corresponding top opening of the computer chassis; and
a top sub-assembly supported above the middle sub-assembly to receive air from the top openings of each computer chassis.
2. The assembly of claim 1 and further comprising a second fan disposed above the top air flow control plane to act in cooperation with the first fan to move air through the vertical cooling air path of each corresponding computer chassis.
3. The assembly of claim 2 wherein the top sub-assembly comprises a double wailed top and forms a plenum to facilitate air flow through the second fan.
4. The assembly of claim 1 and further comprising a bar beneath the bottom air flow control plane and in the lower sub-assembly positioned to support the corresponding computer chassis.
5. The assembly of claim 4 and further comprising bottom rails to movably support the bottom sub-assembly.
6. The assembly of claim 1 wherein each corresponding computer chassis is cylindrical in shape and wherein the airflow control planes contain round openings corresponding to the cylindrical shape of the computer chassis.

7. The assembly of claim 1 wherein the openings in the top airflow control plane are larger than the bottom openings in the bottom airflow control plane to permit insertion and removal of each corresponding computer chassis through the top openings.

8. The assembly of claim 1 wherein the lower sub-assembly comprises multiple cards for storage and networking and wherein the first fan blows air past the multiple cards towards each computer chassis bottom opening.

9. The assembly of claim 8 wherein the bottom air flow control plane has a cable opening positioned to pass cables from the cards in the lower sub-assembly to the connectors of each corresponding computer in the middle sub-assembly.

10. The assembly of claim 9 wherein the cables comprise network cables, and wherein at least two network cables from cards are combined into a single network cable prior to passing through the cable opening in the bottom air flow control plane.

11. The assembly of claim 1 wherein the upper air flow control plane includes handles extending upward to facilitate lifting of the upper air flow control plane for providing physical access to each corresponding computer.

12. A system comprising:
a lower sub-assembly including a first fan;
a middle sub-assembly supported above the lower sub-assembly;
a bottom air flow control plane supported in the middle sub-assembly and having bottom openings, each bottom opening sized to fit and support a perimeter of a corresponding computer, each corresponding computer having a vertical cooling air path through a cylindrical shaped computer chassis such that air is forced through the vertical cooling air path;
a top air flow control plane supported in the middle sub-assembly above the bottom air flow control plane and having top openings having a perimeter larger than a perimeter of the corresponding computer, each top opening sized to fit the corresponding computer through each top opening such that air is forced through a corresponding computer chassis bottom opening, the vertical cooling air path through each corresponding computer, and a corresponding computer chassis top opening: and
a second fan disposed above the bottom air flow control plane to act in cooperation with the first fan to move air through the vertical cooling air paths of each corresponding computer chassis.

13. The system of claim 12 and further comprising a plenum positioned above the middle sub-assembly to facilitate air flow through the second fan.

14. The system of claim 12 and further comprising:
middle rails to moveably support the middle sub-assembly; and
bottom rails to movably support the bottom sub-assembly.

15. The system of claim 12 wherein the bottom airflow control plane bottom openings are round openings corresponding to the cylindrical shape of each corresponding computer, the system further comprising a bar beneath the bottom air flow control plane and in the lower sub-assembly positioned to support each corresponding computer chassis.

16. The system of claim 12 wherein the lower sub-assembly comprises multiple cards for storage and networking and one or more power supplies each having a fan coupled to expel air outside the assembly to cool the one or more supplies.

17. The system of claim 12 and further comprising a top airflow control plane supported in the middle sub-assembly above the bottom air flow control plane and having top openings sized to permit insertion and removal of each corresponding computer through the top openings such that air is forced through the vertical cooling air paths.

18. A system comprising:
a lower sub-assembly including a first fan;
a middle sub-assembly supported above the lower sub-assembly;
a bottom air flow control plane supported in the middle sub-assembly and having bottom openings, each bottom opening sized to fit and support a perimeter of a corresponding computer, each corresponding computer having a vertical cooling air path through a cylindrical shaped computer chassis such that air is forced through the vertical cooling air path;
a top air flow control plane supported in the middle sub-assembly above the bottom air flow control plane and having top openings sized to fit the corresponding computer through each top opening such that air is forced through a corresponding computer chassis bottom opening, the vertical cooling air path through each corresponding computer, and a corresponding computer chassis top opening; and
a bar beneath the bottom air flow control plane and in the lower sub-assembly positioned to support the corresponding computer chassis.

* * * * *